(12) United States Patent
Bibl et al.

(10) Patent No.: US 8,053,956 B2
(45) Date of Patent: Nov. 8, 2011

(54) PIEZOELECTRIC ACTUATORS

(75) Inventors: Andreas Bibl, Los Altos, CA (US);
John A. Higginson, Santa Clara, CA (US)

(73) Assignee: FUJIFILM Dimatix, Inc., Lebanon, NH (US)

(*) Notice: Subject to any disclaimer, the term of this patent is extended or adjusted under 35 U.S.C. 154(b) by 103 days.

(21) Appl. No.: 12/435,099

(22) Filed: May 4, 2009

(65) Prior Publication Data

US 2009/0322187 A1 Dec. 31, 2009

Related U.S. Application Data

(60) Continuation of application No. 11/851,293, filed on Sep. 6, 2007, now Pat. No. 7,526,846, which is a division of application No. 10/967,073, filed on Oct. 15, 2004, now Pat. No. 7,420,317.

(51) Int. Cl.
*H01L 41/047* (2006.01)

(52) U.S. Cl. ........ 310/366; 310/324; 310/328; 310/331; 310/367

(58) Field of Classification Search ................ 310/366, 310/331, 324, 346, 367
See application file for complete search history.

(56) References Cited

U.S. PATENT DOCUMENTS

| | | |
|---|---|---|
| 2,705,392 A | 4/1955 | Imler |
| 4,730,197 A | 3/1988 | Raman et al. |
| 5,071,792 A | 12/1991 | Van Vonno et al. |
| 5,126,615 A | 6/1992 | Takeuchi et al. |
| 5,376,857 A | 12/1994 | Takeuchi et al. |
| 5,691,593 A | 11/1997 | Takeuchi et al. |
| 5,710,584 A | 1/1998 | Suzuki et al. |
| 5,729,263 A | 3/1998 | Thiel et al. |
| 5,736,993 A | 4/1998 | Regimbal et al. |
| 5,790,156 A | 8/1998 | Mutton et al. |
| 5,855,049 A | 1/1999 | Corbett, III et al. |
| 6,013,970 A | 1/2000 | Nishiwaki et al. |
| 6,176,570 B1 | 1/2001 | Kishima et al. |
| 6,198,203 B1 | 3/2001 | Hotomi |

(Continued)

FOREIGN PATENT DOCUMENTS

GB 2 370 153 B 10/2003

(Continued)

OTHER PUBLICATIONS

David T. Chang et al., "Optimized DRIE Etching of Ultra-Small Quartz Resonators", May 4, 2003, 2003 IEEE International Frequency Control Symposium and PDA Exhibition Jointly with the 17th European Frequency and Time Forum, Tampa, FL, IEEE International Frequency Control Symposium, New York, NY, pp. 829-832.

(Continued)

*Primary Examiner* — Walter Benson
*Assistant Examiner* — Bryan Gordon
(74) *Attorney, Agent, or Firm* — Fish & Richardson P.C.

(57) ABSTRACT

Microelectromechanical systems with structures having piezoelectric actuators are described. The structures each have a body that supports piezoelectric islands. The piezoelectric islands have a first surface and a second opposite surface. The piezoelectric islands can be formed, in part, by forming cuts into a thick layer of piezoelectric material, attaching the cut piezoelectric layer to a body having etched features and grinding the piezoelectric layer to a thickness that is less than the depths of the cuts. Conductive material can be formed on the piezoelectric layer to form electrodes.

22 Claims, 14 Drawing Sheets

U.S. PATENT DOCUMENTS

| | | |
|---|---|---|
| 6,364,468 B1 | 4/2002 | Watanabe et al. |
| 6,378,996 B1 | 4/2002 | Shimada et al. |
| 6,402,303 B1 | 6/2002 | Sumi |
| 6,457,221 B1 | 10/2002 | Park |
| 6,491,384 B2 | 12/2002 | Usui et al. |
| 6,502,928 B1 | 1/2003 | Shimada et al. |
| 6,530,653 B2 | 3/2003 | Le et al. |
| 6,568,797 B2 | 5/2003 | Yamauchi et al. |
| 6,626,526 B2 | 9/2003 | Ueki et al. |
| 6,664,126 B1 | 12/2003 | Devoe et al. |
| 6,705,708 B2 | 3/2004 | Murai |
| 6,716,363 B1 | 4/2004 | Wright et al. |
| 6,753,638 B2 | 6/2004 | Adams et al. |
| 6,767,085 B2 | 7/2004 | Murai |
| 6,949,869 B2 | 9/2005 | Junhua |
| 7,042,141 B2 | 5/2006 | Funakubo et al. |
| 7,052,117 B2 | 5/2006 | Bibl et al. |
| 7,098,571 B2 | 8/2006 | Adams et al. |
| 7,388,319 B2 | 6/2008 | Bibl et al. |
| 7,420,317 B2 | 9/2008 | Bibl et al. |
| 7,526,846 B2 | 5/2009 | Bibl et al. |
| 2002/0030723 A1 | 3/2002 | Sumi et al. |
| 2003/0155842 A1* | 8/2003 | Hobelsberger ............... 310/331 |
| 2004/0004649 A1 | 1/2004 | Bibl et al. |
| 2004/0104977 A1* | 6/2004 | Mitsuhashi et al. ............ 347/68 |
| 2004/0104978 A1* | 6/2004 | Iwashita et al. ................. 347/68 |
| 2004/0121528 A1 | 6/2004 | Krulevitch et al. |
| 2005/0099467 A1* | 5/2005 | Bibl et al. ....................... 347/68 |
| 2005/0118246 A1* | 6/2005 | Wong et al. .................... 424/449 |
| 2005/0272183 A1* | 12/2005 | Lukacs et al. ................. 438/109 |
| 2006/0082256 A1* | 4/2006 | Bibl et al. ..................... 310/328 |
| 2006/0082257 A1* | 4/2006 | Bibl et al. ..................... 310/334 |

FOREIGN PATENT DOCUMENTS

| | | |
|---|---|---|
| JP | 57-167272 | 10/1982 |
| JP | 10-217466 | 8/1998 |
| JP | 10-264385 A | 10/1998 |
| JP | H10-2643385 | 10/1998 |
| WO | WO 03/049209 A1 | 6/2003 |
| WO | WO 2006/015378 A2 | 2/2006 |

OTHER PUBLICATIONS

International Search Report and Written Opinion of the International Searching Authority, International Application No. PCT/US2005/036441, Feb. 10, 2006, 14 pp.

International Search Report and Written Opinion of the International Searching Authority, International Application No. PCT/US2005/036926, Feb. 10, 2006, 12 pp.

* cited by examiner

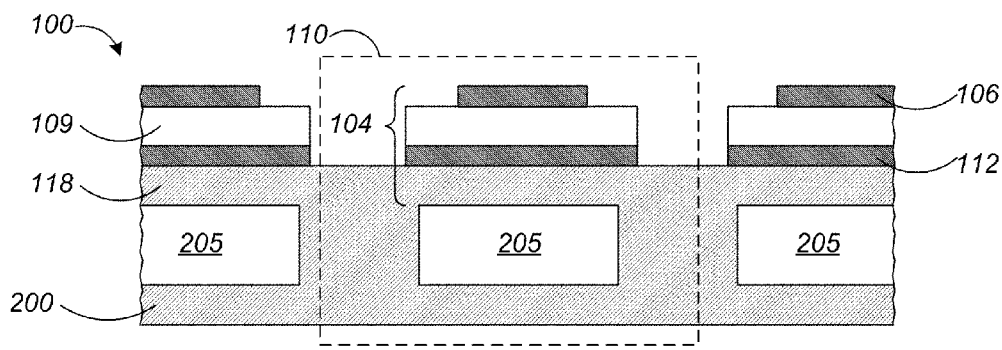
FIG._1A
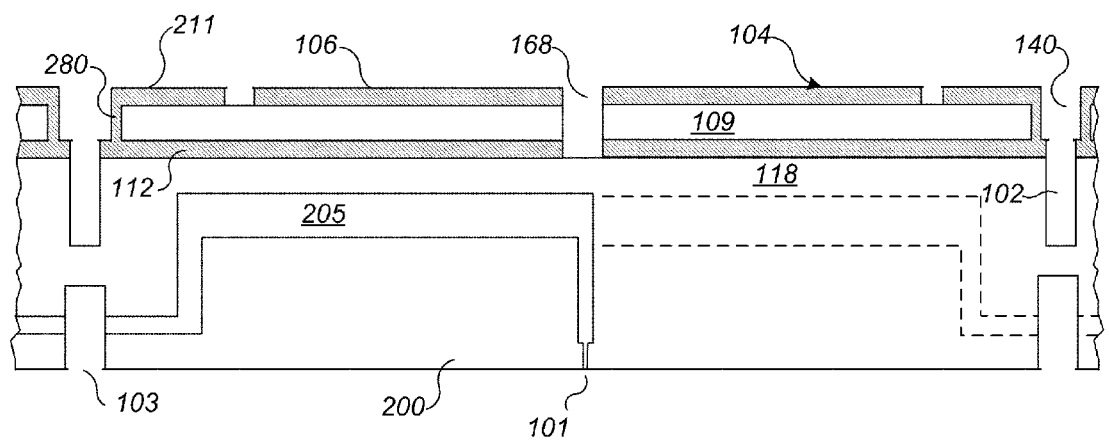
FIG._1B
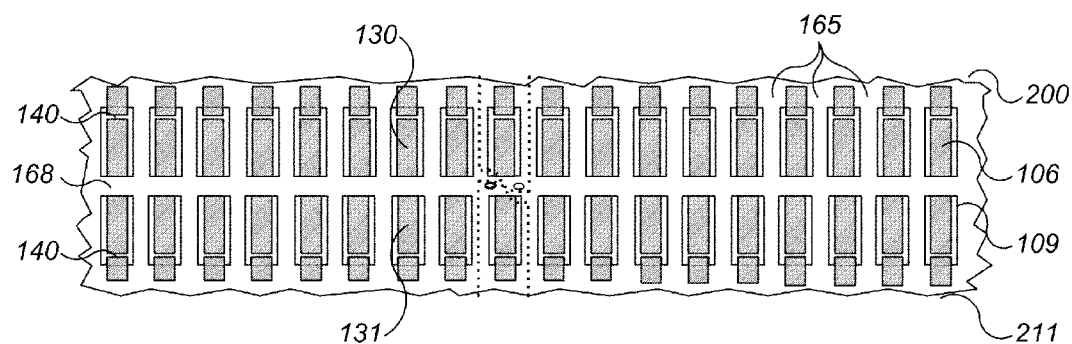
FIG._1C

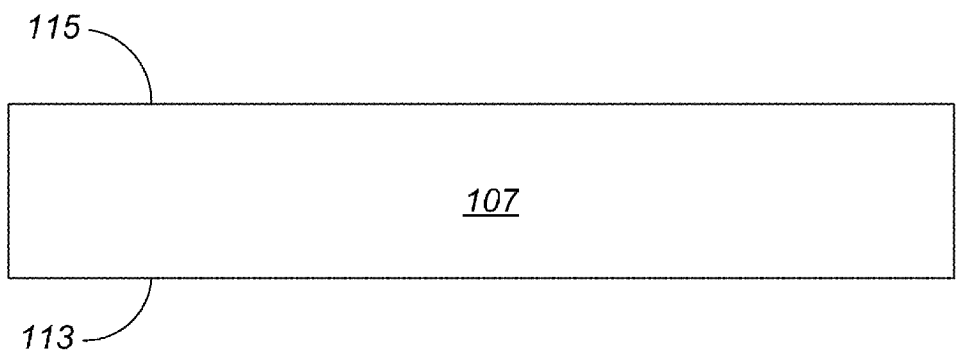
FIG._2
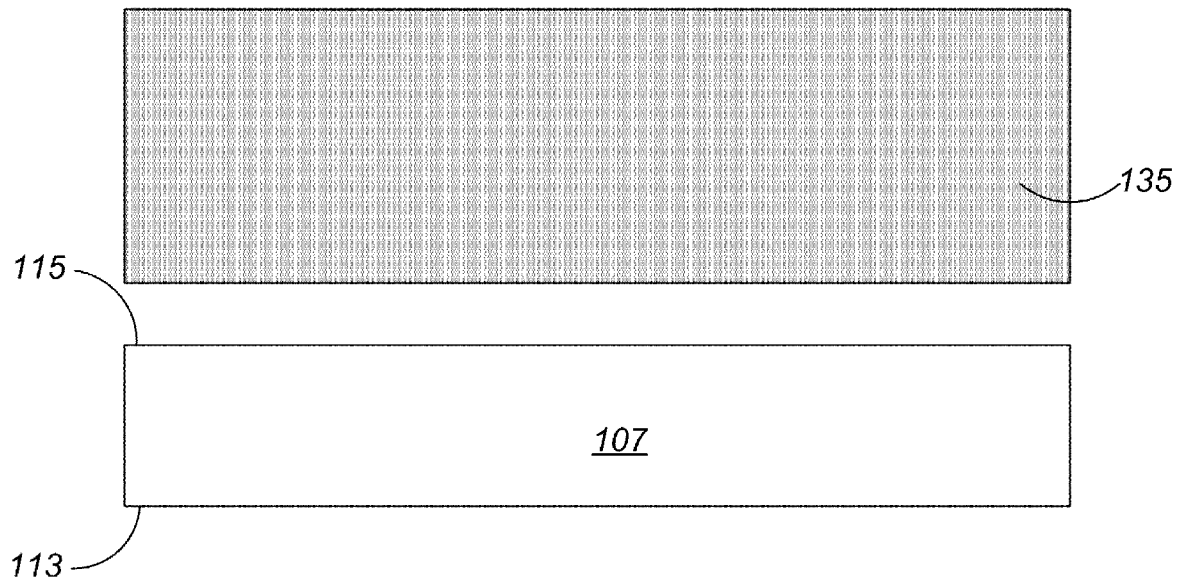
FIG._3

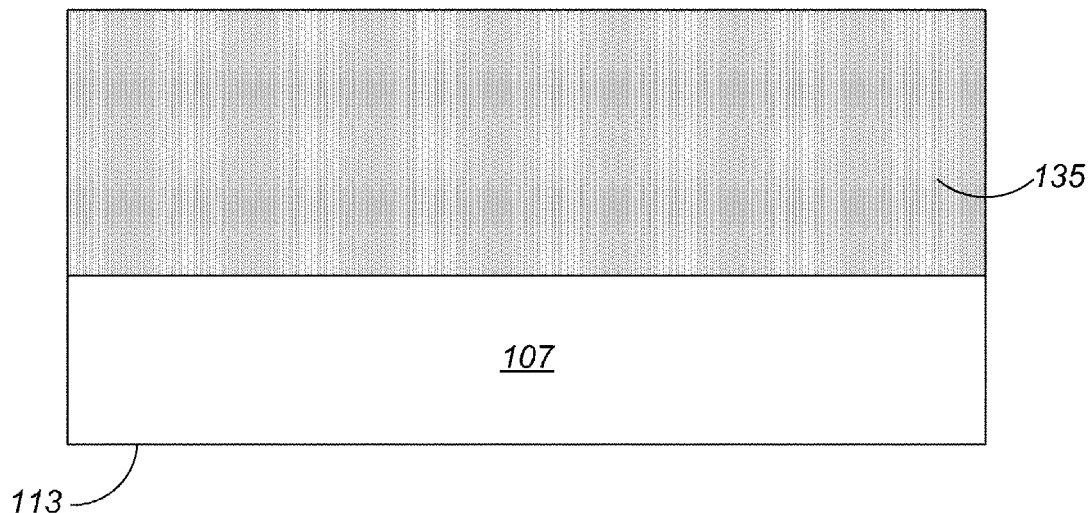
FIG._4
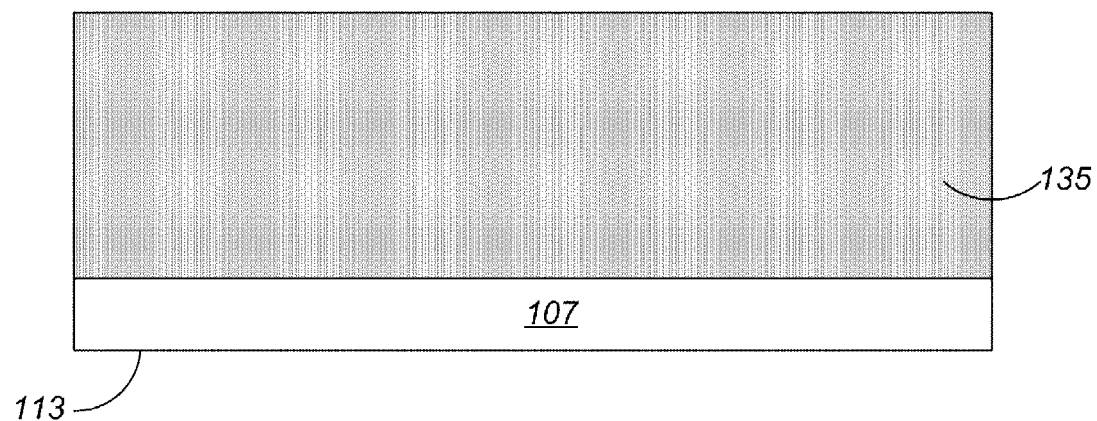
FIG._5

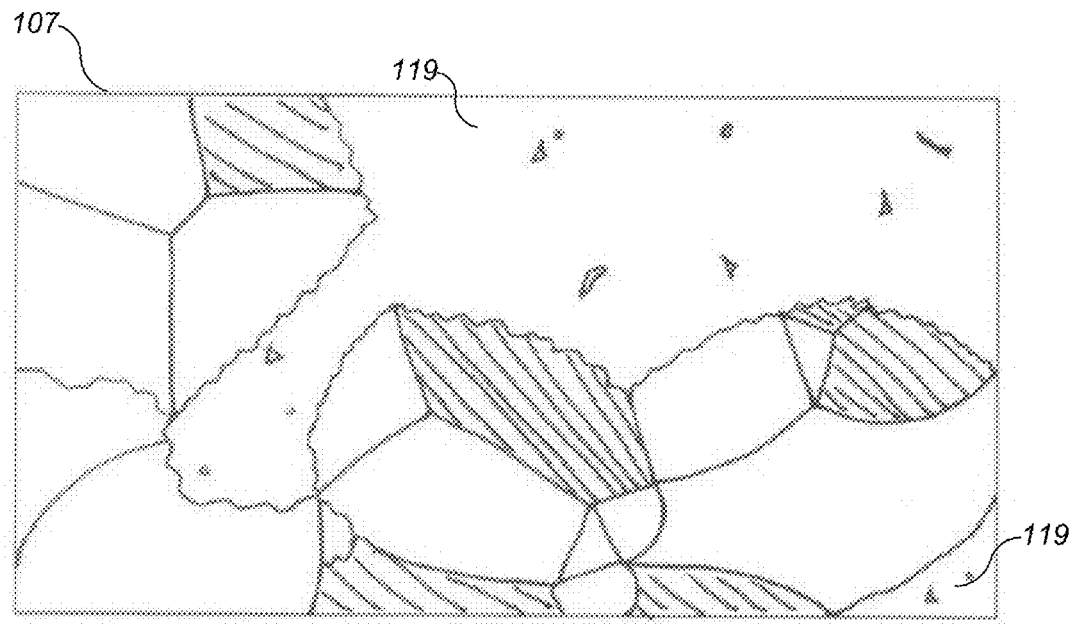
FIG._5A
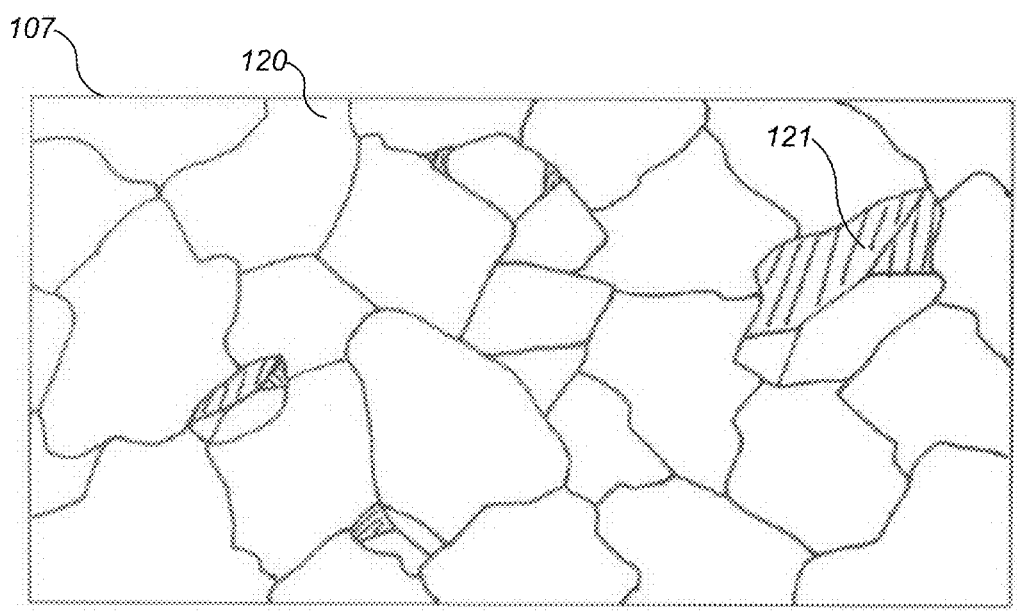
FIG._5B

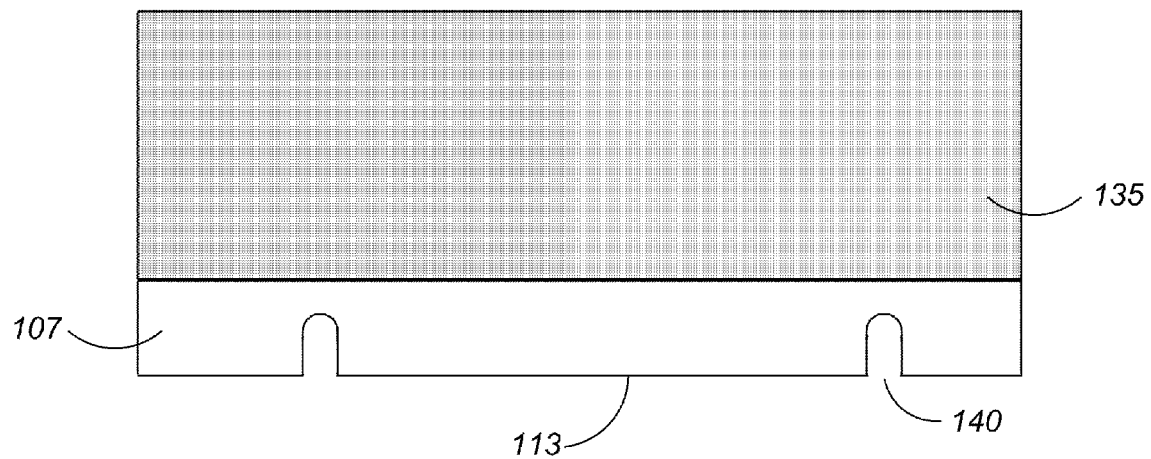
FIG._6
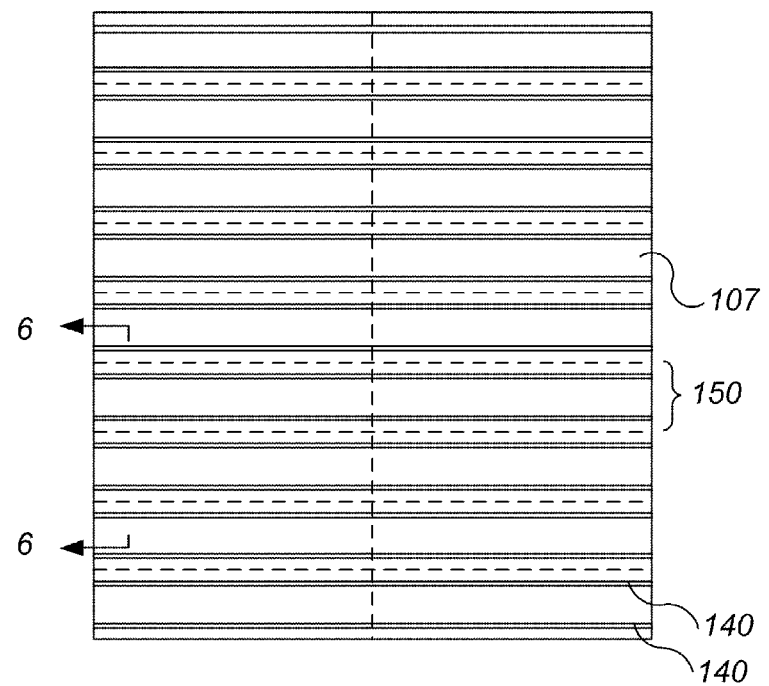
FIG._7

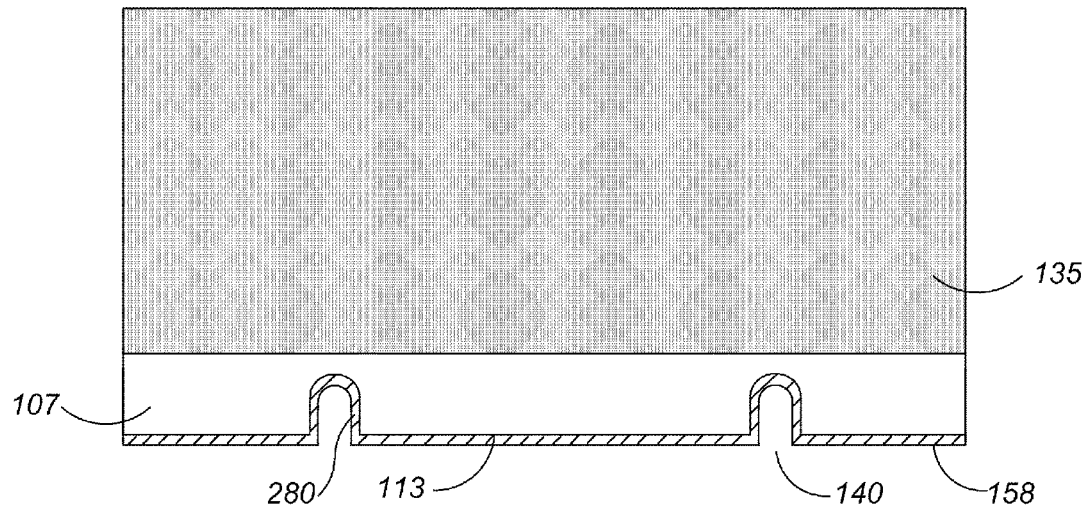
FIG._8
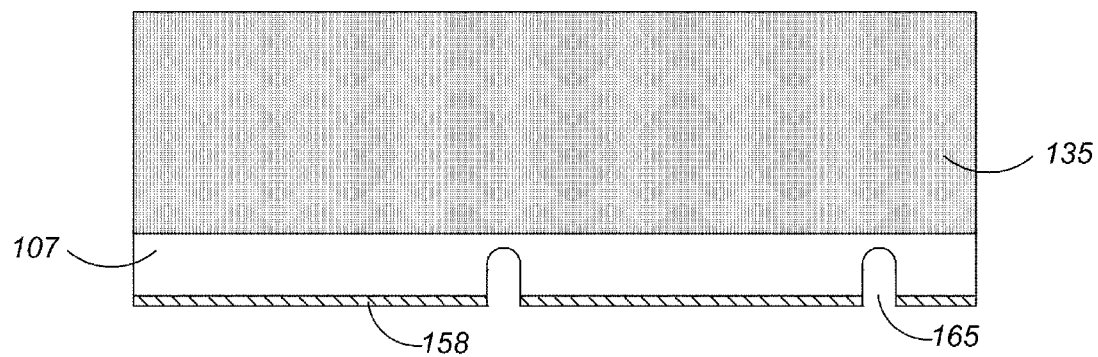
FIG._9

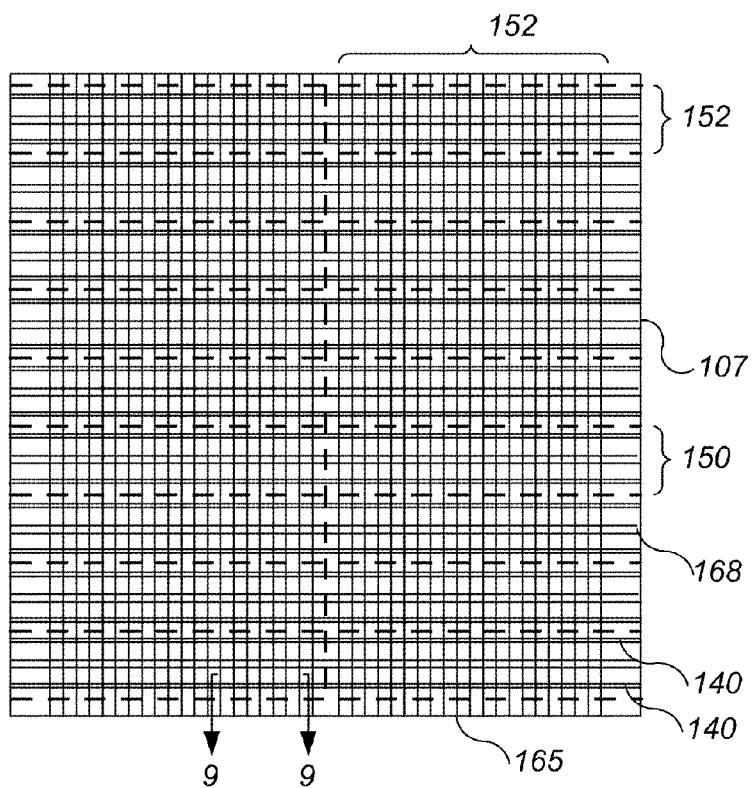
FIG._10
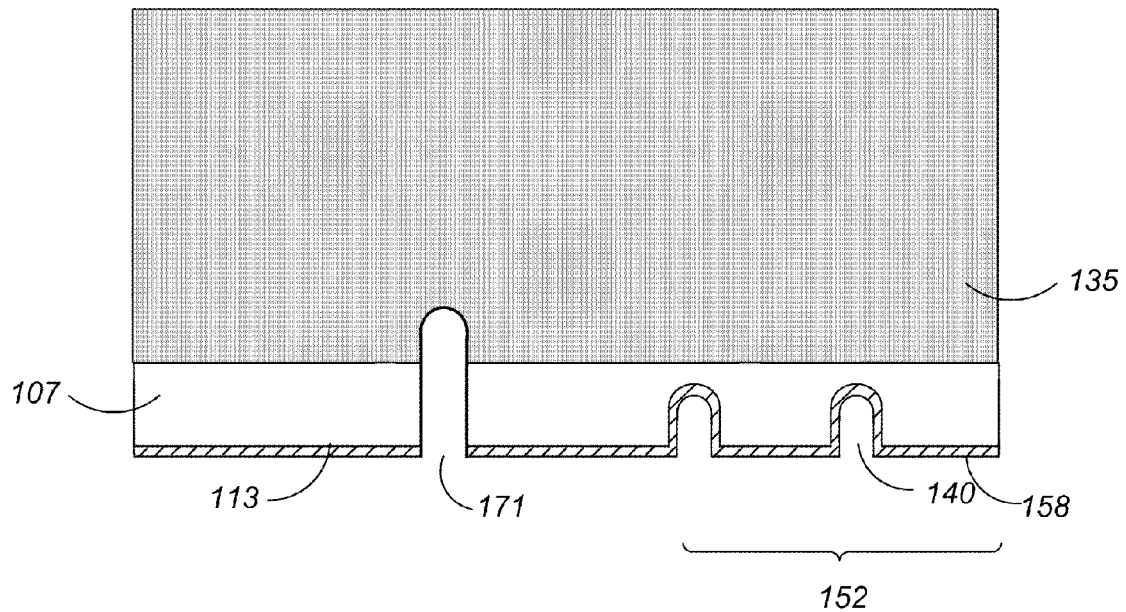
FIG._11

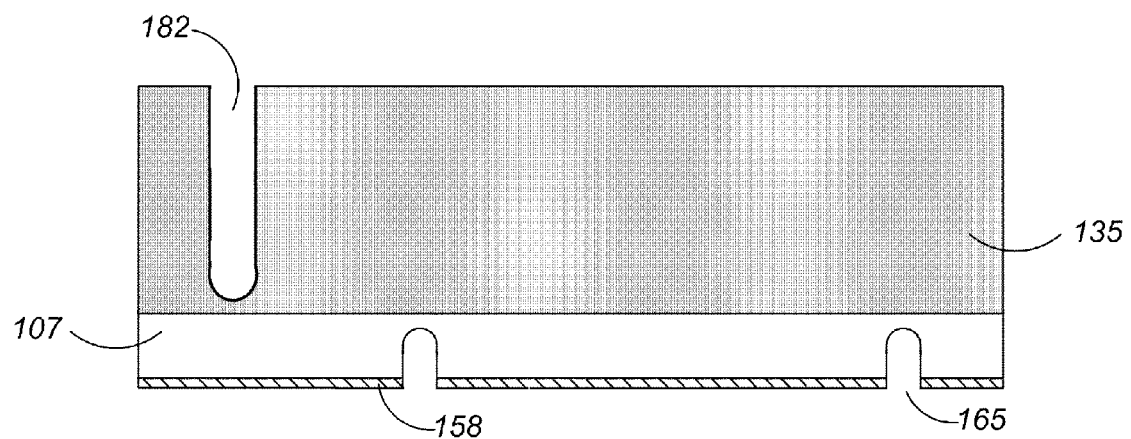
FIG._12
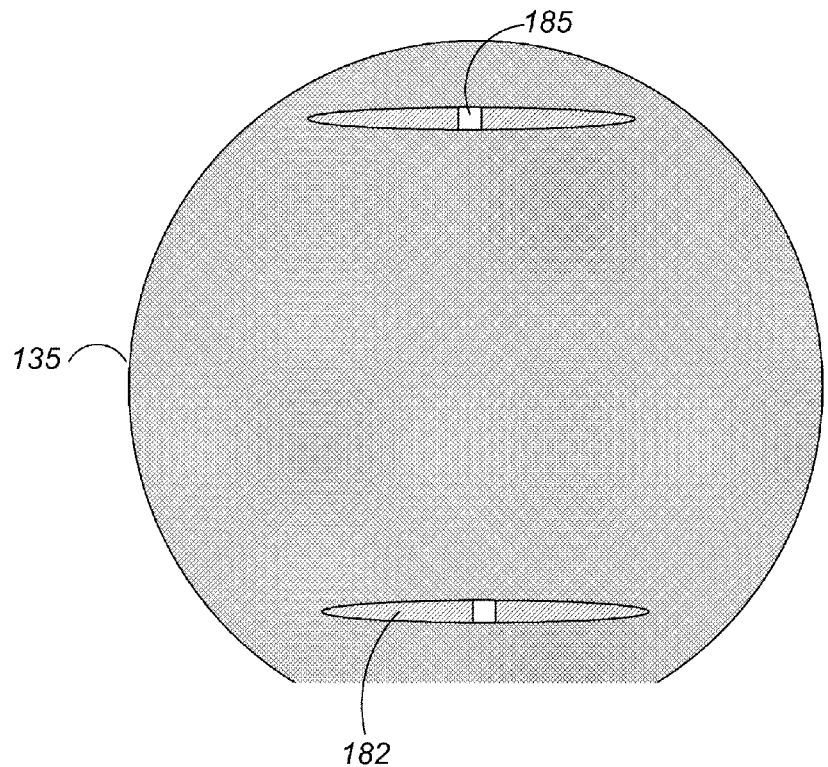
FIG._13

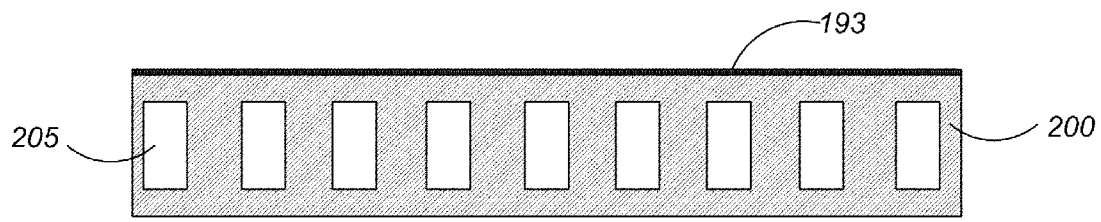
FIG._14
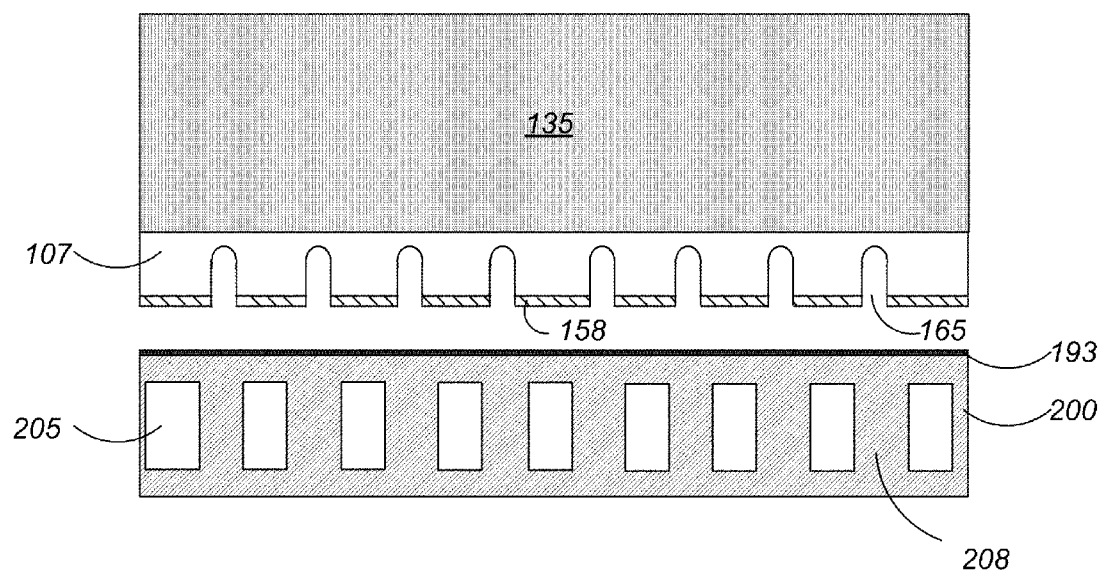
FIG._15

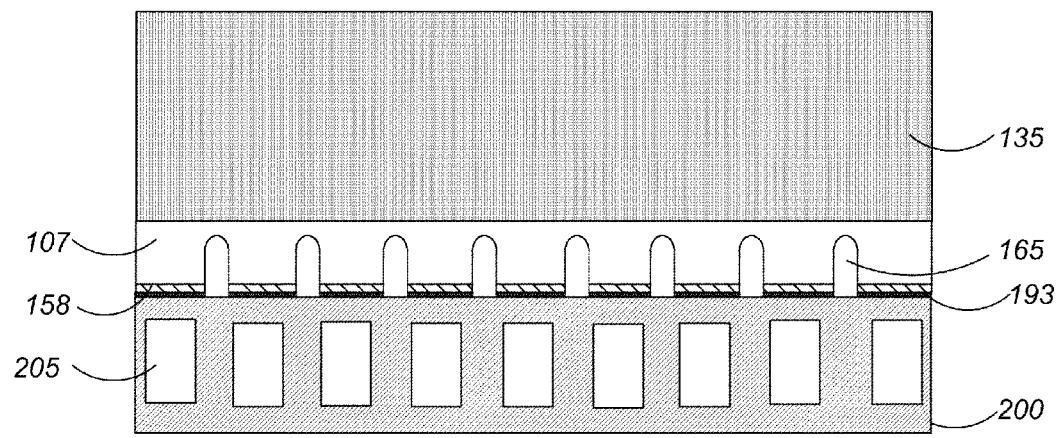
FIG._16
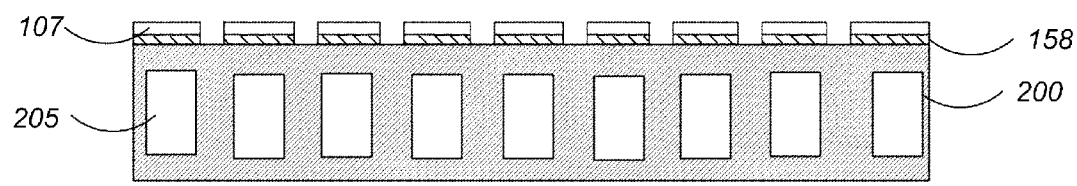
FIG._17
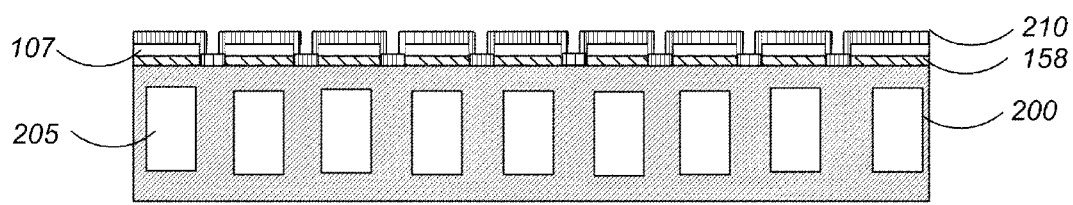
FIG._18

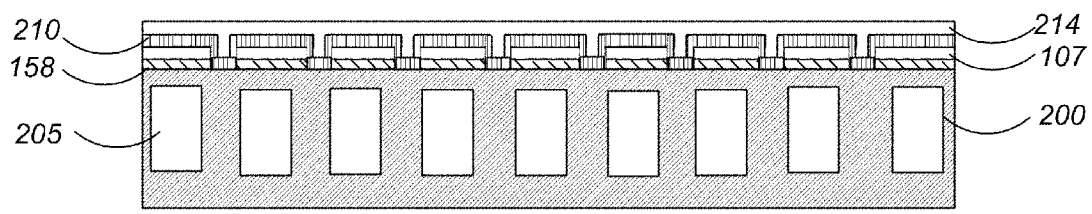
FIG._19
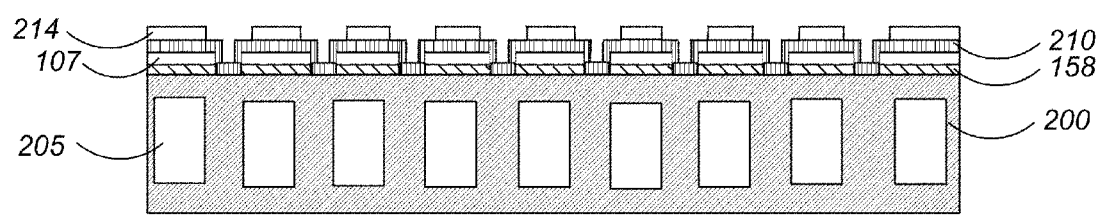
FIG._20

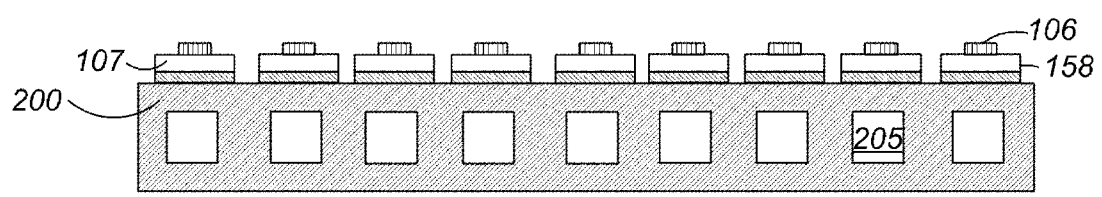
FIG._21
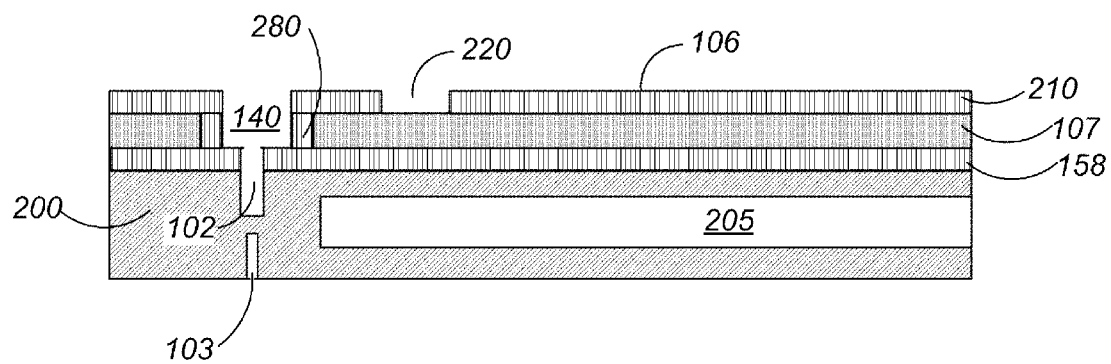
FIG._22

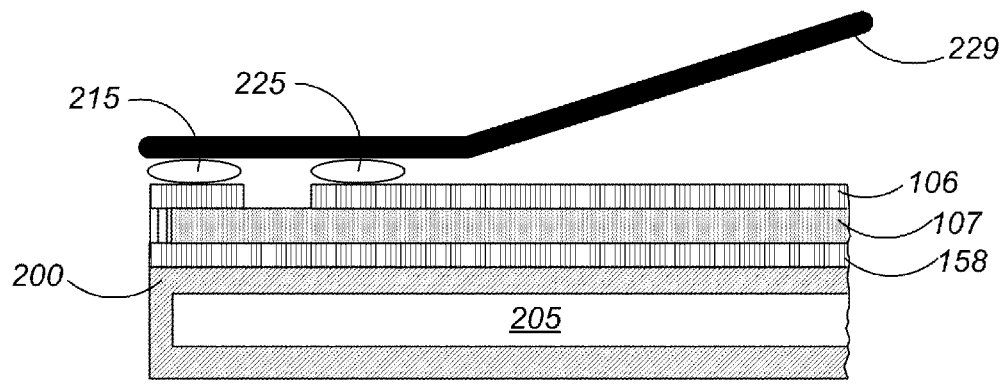
FIG._23
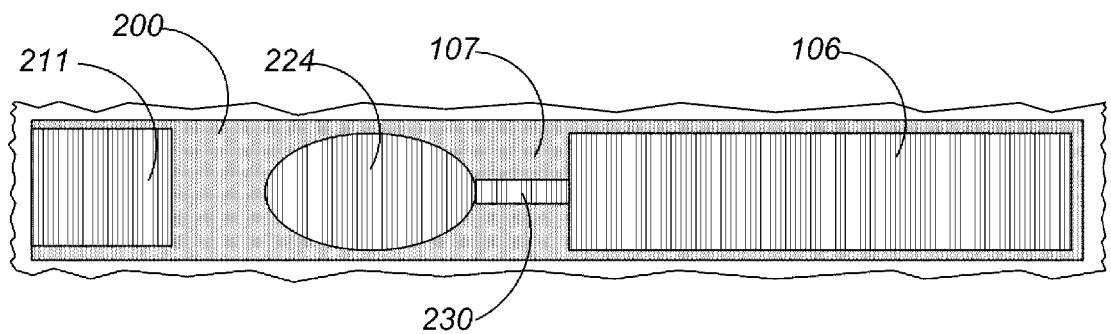
FIG._24

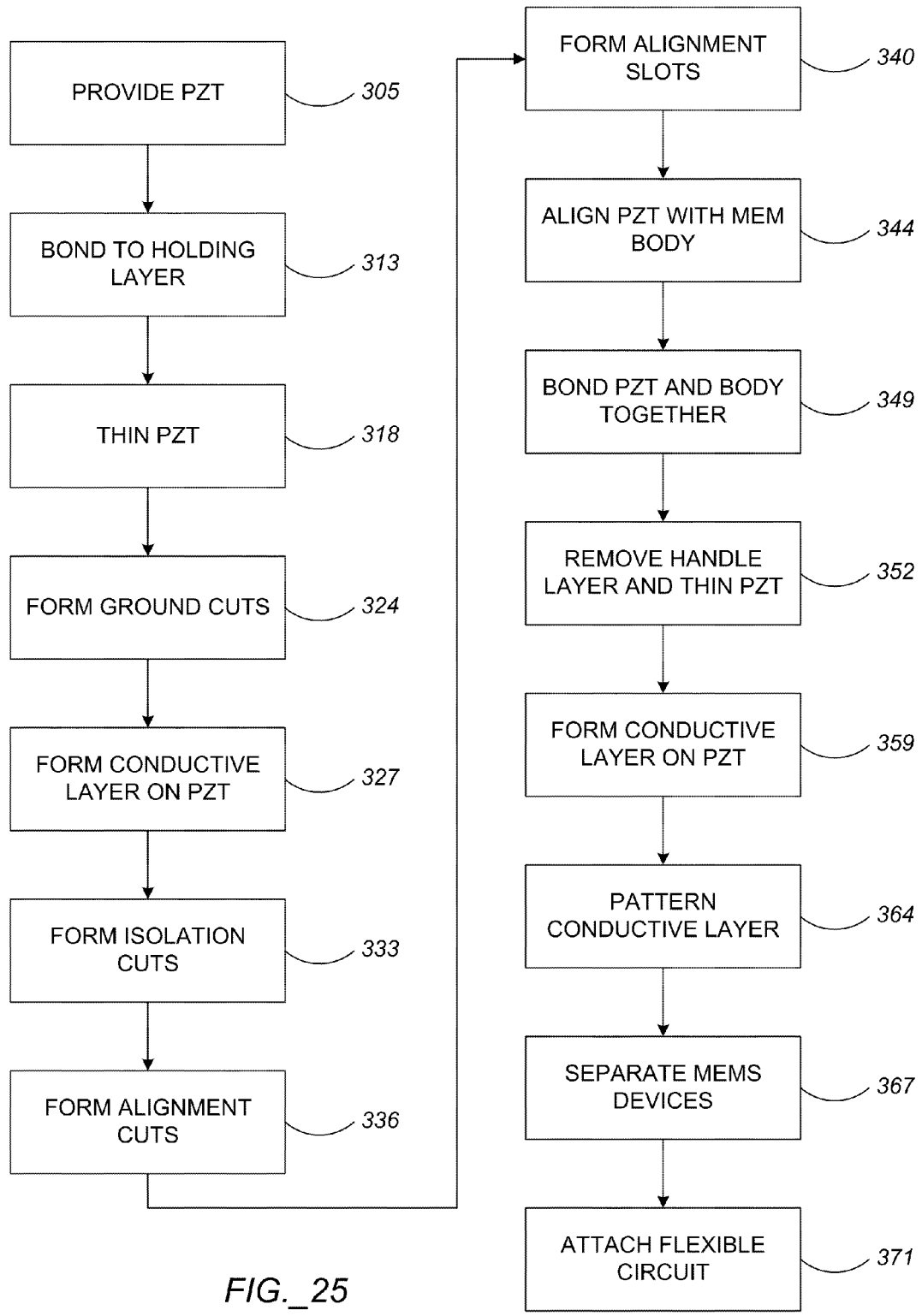
FIG._25

PIEZOELECTRIC ACTUATORS

CROSS-REFERENCE TO RELATED APPLICATIONS

This application is a continuation application and claims the benefit of priority under 35 U.S.C. Section 120 of U.S. application Ser. No. 11/851,293, filed Sep. 6, 2007, which is a divisional application of U.S. application Ser. No. 10/967,073, filed Oct. 15, 2004, which is now U.S. Pat. No. 7,420,317. The disclosure of these prior applications are considered part of and are incorporated by reference in the disclosure of this application.

BACKGROUND

This invention relates to forming piezoelectric actuators for microelectromechanical devices.

Piezoelectric materials can generate electricity or an electric polarity when subjected to mechanical stress. Alternatively, applying a voltage across a piezoelectric material can cause converse piezoelectricity, that is, the piezoelectric material mechanically deforms when a voltage is applied. Converse piezoelectricity can cause bending forces in the piezoelectric material that are extremely high. Both of these properties, generating electricity and converse piezoelectricity, are harnessed for use in electrical and mechanical devices, such as transducers, e.g., actuators and sensors. Multiple transducers, including a combination of actuators and sensors, can be combined together in a microelectromechanical system (MEMS).

A MEMS typically has mechanical structures formed in a semiconductor substrate using conventional semiconductor processing techniques. A MEMS can include a single structure or multiple structures. MEMS have an electrical component, where an electrical signal activates each or is produced by actuation of each structure in a MEMS.

One implementation of a MEMS includes a body having chambers formed in the body and a piezoelectric actuator formed on an exterior surface of the body. The piezoelectric actuator has a layer of piezoelectric material, such as a ceramic, and elements for transmitting a voltage, such as electrodes. The electrodes of the piezoelectric actuator can either apply a voltage across the piezoelectric material or transmit a voltage that is produced when the piezoelectric material is deformed.

One type of MEMS with piezoelectric actuators are microfluidic ejection devices. An actuator can include piezoelectric material that can be actuated by electrodes, causing the piezoelectric material to deform towards a chamber of the device. This deformed actuator pressurizes the chamber, causing fluid in the chamber to exit, for example, through a nozzle. Each structure component, including the actuator, the chamber and the nozzle, can affect how much fluid is ejected. In a MEMS with multiple structures, forming uniform sized components for each structure across the MEMS can improve the uniformity of performance of the MEMS, such as the uniformity of fluid quantities that are ejected. Forming uniform structures can be challenging when attempting to process each structure to have measurements that are within a few microns of other structures in the MEMS.

SUMMARY

In general, in a microelectromechanical device is described. The device has a body and a plurality of piezoelectric islands. The body has a plurality of chambers. The plurality of piezoelectric islands are supported by the body, wherein each of the piezoelectric islands has a first surface, a second surface opposing the first surface and a third planar surface interconnecting the first and second surfaces. A conductive material is on the first surface and a conductive material is on the second surface of the piezoelectric islands. At least one of the plurality of piezoelectric islands is positioned substantially adjacent to a corresponding chamber of the plurality of chambers. At least one of the piezoelectric islands has a conductive material on the third surface, the conductive material on the third surface electrically contacting the conductive materials on the first and second surfaces.

In general, in another aspect, a microelectromechanical device is described. The device has a plurality of chambers. The device also has transducer layer. The transducer layer provides a plurality of transducers, each transducer positioned substantially adjacent to a corresponding chamber of the plurality of chambers, each transducer including a piezoelectric island supported by the body. The piezoelectric island is defined by a first surface and a second surface opposite to the first surface, the first and second surfaces are substantially planar and the first surface is substantially parallel to the second surface. A bonding layer between the transducer layer and the body.

In another aspect, a method of forming a device with a piezoelectric transducer is described. First recesses are formed into a first surface of a body of piezoelectric material, the first recesses having walls. After forming the first recesses, the first surface of the body of piezoelectric material are attached to a device body. After attaching the body of piezoelectric material to the device body, material from the second surface of the body of piezoelectric material is removed at least until the first recesses are exposed.

In yet another aspect, a microelectromechanical device is described. The device has a body having a planar surface. One or more transducers are supported by the body, wherein each transducer includes a rectangular block of piezoelectric material, the block having a first surface and a second surface. The first surface of the block is parallel and adjacent to the planar surface of the body, the second surface of the block is substantially perpendicular to the planar surface of the body and the one or more transducers are not connected together.

Potential advantages of the invention may include one or more (or none) of the following. Forming ground cuts into a piezoelectric material prior to forming a conductive layer can permit formation of wrap-around electrodes. These wrap-around electrodes can enable creation of an electrode contact area on the opposite side of the piezoelectric material from the side on which the electrode is formed. The wrap-around electrode can electrically connect the electrode and the electrode connect area. A flexible circuit can be attached to both the drive and ground electrode by contacting the flexible circuit to only one side of the piezoelectric material.

Forming a piezoelectric actuator from piezoelectric material that is processed prior to attaching to a chamber body can increase the variety of processing steps that can be used to form the piezoelectric material, because the sensitivity of the chamber body to the processes used for forming the actuator need not be accounted for. Dicing the piezoelectric material prior to bonding onto the chamber body can reduce or eliminate cuts formed in the chamber body, thereby reducing leaks in the chamber body. Cutting deeper into a block of piezoelectric material than the depth of the final piezoelectric layer in the piezoelectric actuator and grinding the piezoelectric material to the desired thickness of the final piezoelectric layer can permit formation of a group of uniformly thick piezoelectric actuators. The wear and radius of the saw blade may have less impact on the uniformity of the piezoelectric actuators when cuts are made deeper into a starting block of piezoelectric material than the thickness of final piezoelectric layer. Uniformly thick actuators can provide uniform piezoelectric response to applied drive voltages. Uniform piezoelectric response can result in similar behavior between structures in a MEMS. Uniform piezoelectric response in a fluid ejection MEMS can result in ejecting a uniform quantity of fluid from each of the structures when a similar amount of power is applied to each of the structure's actuators. Additionally, maintaining uniformly thick piezoelectric actuators can maintain the quantity of fluid ejected from the structures in one MEMS to the structures in another MEMS. In forming an actuator, cutting the piezoelectric material prior to bonding the material to the chamber body can eliminate tabs of piezoelectric material between the actuators, thereby reducing cross-talk between the structures.

The piezoelectric material can be bonded to a handle layer prior to processing. The handle material can control the expansion of the piezoelectric material in response to heating. When particular piezoelectric materials are heated, such as lead zirconate titanate, the material expands at a variable rate. As the material is brought back to room temperature, the material may not immediately return to its pre-heated dimensions. If the chamber body and the handle layer are both formed of silicon, which expands at a predictable and constant rate as temperature is increased, the handle layer can control the expansion of the piezoelectric material caused during a heating bonding process, so that the piezoelectric material expands at approximately the same rate as the chamber body expands. Consequently, misalignment occurring during heating may be reduced. In addition, the handle layer can be secured by a mechanical handling device when the piezoelectric material is being processed. This reduces the potential damage to the piezoelectric material during processing caused by the handling device. Additional processing may be possible with the handle layer that may not be possible when the mechanical handling device holds the piezoelectric material directly and the piezoelectric material becomes too thin to both secure and process at the same time. The handle layer may also include alignment feature, which may facilitate accurate alignment of actuator precursors in the piezoelectric material to chambers in the MEMS body. The handle layer can be wider than the piezoelectric layer. The alignment features can be located in an area outside of the piezoelectric layer.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1A is a cross-sectional end view of a part of a MEMS with piezoelectric actuators.

FIG. 1B is a cross-sectional side view of a portion of a die having two fluid ejection MEMS with piezoelectric actuators.

FIG. 1C is a top view of a MEMS device having piezoelectric actuators.

FIG. 2 shows a piezoelectric material.

FIG. 3 shows the piezoelectric material and a silicon wafer.

FIG. 4 shows an assembly of the piezoelectric material bonded to the silicon wafer.

FIG. 5 shows the assembly after thinning the piezoelectric material.

FIG. 5A shows an enlarged view of a surface of a ground piezoelectric material.

FIG. 5B shows an acid clean piece of ground piezoelectric material.

FIG. 6 shows the assembly with ground cuts formed in the bottom of the material.

FIG. 7 is a bottom view of one implementation of a diced piezoelectric material.

FIG. 8 shows a cross-sectional view of the piezoelectric material along the X-axis after forming a conductive layer.

FIG. 9 shows a cross-sectional view of the piezoelectric material along the Y-axis after separation cuts are made.

FIG. 10 is a bottom view of one implementation of the piezoelectric material with separation cuts, isolation cuts and ground cuts.

FIG. 11 shows a cross-sectional view of the piezoelectric material along the X-axis with the ground cuts and alignment cuts.

FIG. 12 shows a cross-sectional view of the assembly after alignment slots are made in the silicon layer.

FIG. 13 is a top view of the silicon wafer with the alignment holes.

FIG. 14 shows a cross-sectional view of a chamber body.

FIG. 15 shows the chamber body aligned with the incomplete actuator assembly.

FIG. 16 shows the chamber body and piezoelectric material bonded together.

FIG. 17 shows the chamber body with partially formed actuators.

FIG. 18 shows the piezoelectric islands after a top conductive layer is formed.

FIG. 19 shows the piezoelectric islands after application of a photoresist.

FIG. 20 shows the photoresist after patterning.

FIG. 21 is an end-wise cross-sectional view of multiple structures where each chamber has an individual actuator.

FIG. 22 is a cross-sectional side view of a structure with a completed piezoelectric actuator.

FIG. 23 shows a single structure with a flexible circuit attached to the actuator.

FIG. 24 is a plan view of one embodiment of an actuator.

FIG. 25 is a flow diagram of the steps for forming a MEMS with structures having piezoelectric actuators.

Like reference symbols in the various drawings indicate like elements. The items in the drawings are not to scale. Some items have been enlarged for demonstration purposes.

DETAILED DESCRIPTION

A method for forming a MEMS with structures each having a piezoelectric actuator is described. As shown in FIGS. 1A, 1B and 1C, a MEMS device 100 has a body 200 supporting piezoelectric actuators 104, the body 200 having multiple transducer structures 110. The body 200 has chambers 205 formed in a layer of material. The chambers 205 can be closed off from the outside atmosphere, such as in a pressure transducer, or open to the outside atmosphere, such as to eject fluid. The body 200 can be a unitary layer of a single material. Alternatively, the body 200 can be constructed of multiple layers joined together, either of a single material or multiple materials.

The piezoelectric actuator 104 can include a top electrode 106, a piezoelectric layer 109 and a bottom electrode 112. The piezoelectric actuator 104 can include a membrane 118 formed over the chambers 205. The membrane 118 can isolate the chambers 205 from the piezoelectric layer 109. In one implementation, the bottom electrode 112 is electrically connected to a bottom electrode contact area 211 by a conductive wrap-around 280. In one implementation, the bottom electrode 112 can be in communication with other bottom electrodes 112. The conductive wrap-around 280 is formed in a ground cut 140, as described further below. An insulator layer (not shown), such as an oxide layer, can be located between the bottom electrode 112 and the body 200. In one implementation, the body 200 serves as a bottom electrode. If the body forms the bottom electrode, only the top electrode 106 and piezoelectric layer 109 are required to form the piezoelectric actuator. Other electrode configurations can also be selected, such as a side-by-side arrangement of electrodes. A layer of bonding material, such as an adhesive, can optionally be located between the piezoelectric layer 109 and the body 200.

A circuit (not shown) can be electrically connected to the bottom electrode 112 at the bottom electrode contact area 211, and to the top electrode 106. The circuit can apply a voltage to the electrodes. The applied voltage can actuate the piezoelectric layer 109, causing the piezoelectric material to contract. When the piezoelectric material contracts, the contraction causes the attached membrane 118 to deflect toward the chamber 205, pressurizing the chamber 205. In one implementation, pressurizing the chamber 205 can cause fluid to eject from chamber 205 and out a nozzle 101. In another implementation, the chamber 205 is not pressurized by the actuator, but pressurized (or depressurized) by an environmental event. The change in pressure in the chamber 205 can cause the piezoelectric layer 109 to contract, thereby creating a voltage that can be transmitted by the electrodes 112, 106 and sensed by the circuit.

As shown in FIG. 1B, in one implementation a MEMS can be constructed with two rows of fluid ejection structures, such that structures in the two rows face the center of the device and the nozzles are arranged substantially in a line. The structures each have a longitudinal center that runs the length of the chamber 205. The center of a structure in one row can align with the center of a structure in the other row. The cross-sectional view of the structure shows the center of one structure in a first row and a phantom of a structure in a second row (the chamber of a second structure is shown in phantom). An isolation cut 168 can be formed over the nozzle 101 so that fluid ejection structures that face one another have actuators that are electrically and physically isolated from one another.

Multiple piezoelectric actuators, where each piezoelectric actuator is a part of one structure of a MEMS having multiple structures, can be formed from a single layer of piezoelectric material. This allows for parallel processing of multiple actuators at one time. For simplicity, a method of forming a piezoelectric actuator for a single structure will be described below with respect to most figures. The piezoelectric layer 109 and the body 200 can be cut or etched such that each MEMS can be separated from the other MEMS. In one implementation, streets 103 are etched and saw cuts 102 are made in the body 200. The MEMS can be manually broken away along the streets 103 and saw cuts 102. As shown in FIG. 25, the body 200 and the piezoelectric layer 109 can be processed separately and joined together at a later stage of processing.

As shown in FIGS. 2 and 25, forming the piezoelectric actuator begins with providing a starting layer of piezoelectric material (step 305), such as lead zirconate titanate (piezoelectric layer 107), although other piezoelectric materials can be used. In one implementation, the PZT has a density of about 7.5 g/cm$^3$ or more, e.g., about 8 g/cm$^3$. The d31 coefficient can be about 200 or greater. HIPS-treated piezoelectric material is available as H5C and H5D from Sumitomo Piezoelectric Materials, Japan. The H5C material exhibits an apparent density of about 8.05 g/cm$^3$ and d31 of about 210. The H5D material exhibits an apparent density of about 8.15 g/cm$^3$ and a d31 of about 300. Substrates are typically about 1 cm thick and can be sawn to the desired working thickness. The piezoelectric material can be formed by techniques including pressing, doctor blading, green sheet, sol gel or deposition. Piezoelectric material manufacture is discussed in Piezoelectric Ceramics, B. Jaffe, Academic Press Limited, 1971, the entire contents of which are incorporated herein by reference. Forming methods, including hot pressing, are described at pages 258-9. Single crystal piezoelectric material such as lead-magnesium-niobate (PMN), available from TRS Ceramics, Philadelphia, Pa., can also be used. Bulk PZT materials can have higher d coefficients, dielectric constants, coupling coefficients, stiffness and density than sputtered, screen printed or sol-gel formed PZT materials.

These properties can be established in a piezoelectric material by using techniques that involve firing the material prior to attachment to a body. For example, piezoelectric material that is molded and fired by itself (as opposed to on a support) has the advantage that high pressure can be used to pack the material into a mold (heated or not). In addition, fewer additives, such as flow agents and binders, are typically required. Higher temperatures, 1200-1300° C. for example, can be used in the firing process, allowing better maturing and grain growth. Unlike piezoelectric layers that are formed by sol gel or sputtering techniques, the grains in a bulk piezoelectric material can have a width of between about two and four microns. Firing atmospheres (e.g., lead enriched atmospheres) can be used to reduce the loss of PbO (due to the high temperatures) from the ceramic. The outside surface of the molded part that may have PbO loss or other degradation can be cut off and discarded. The material can also be processed by hot isostatic pressing (HIPs), during which the ceramic is subject to high pressures. The Hipping process can be conducted during firing or after a block of piezoelectric material has been fired, and is used to increase density, reduce voids and increase piezoelectric constants. The Hipping process can be conducted in an oxygen or oxygen/argon atmosphere.

The starting layer of piezoelectric material can be between about 100 and about 400 microns, such as between around 250 and about 300 microns, thick. The piezoelectric material has a bottom surface 113 and a top surface 115, where the bottom surface 113 will eventually be the surface that is closest the chamber body.

As shown in FIG. 3, a handle layer 135 of material, such as silicon, is placed over the top surface 115 of the piezoelectric layer 107. The handle layer 135 can be formed of the same material that is used to form the body 200. The handle layer 135 provides a layer for holding and transporting the piezoelectric layer 107 so that the piezoelectric layer 107 is not damaged during processing. The handle layer 135 will also control the expansion of the piezoelectric layer 107 during a subsequent heating and bonding step, as described further below. The handle layer 135 can be between 400 to 1000 microns thick, although the exact thickness is relatively unimportant. In one implementation, the handle layer 135 is wider than the piezoelectric layer 107.

As shown in FIG. 4, the handle layer 135 is bonded to the piezoelectric layer 107 (step 313, FIG. 25). The bond can be achieved by applying an adhesive, such as polymerized benzocyclobutene (BCB), to either the piezoelectric layer 107 or the handle layer 135 and then pressing the two layers together. The adhesive can then be cured, such as by heating the assembly.

Referring to FIG. 5, the piezoelectric layer 107 can then be thinned so that it is thicker than the final desired thickness of the piezoelectric portion of the actuator (item 109 in FIG. 1), but thinner than the starting layer of piezoelectric material (step 318, FIG. 25). In one implementation, the piezoelectric layer 107 is thinned to less than about 200 microns, or about 50 microns.

To thin the piezoelectric layer 107, a precision grinding technique, such as horizontal grinding, can be used to produce a highly uniform thin layer having a smooth, low void surface morphology. In horizontal grinding, a workpiece is mounted on a rotating chuck having a reference surface machined to a high flatness tolerance. The exposed surface of the workpiece is contacted with a horizontal grinding wheel, also in alignment at high tolerance. The grinding can produce flatness and parallelism of, e.g., about 0.25 microns or less, e.g., about 0.1 microns or less, and a surface finish to 5 nm Ra or less over a substrate. The grinding also produces a uniform residual stress.

A suitable precision grinding apparatus is Toshiba Model UHG-130C, available through Cieba Technologies, Chandler, Ariz. The substrate can be ground with a rough wheel followed by a fine wheel. A suitable rough and fine wheel have 1500 grit and 2000 grit synthetic diamond resinoid matrices, respectively. Suitable grinding wheels are available from Adoma or Ashai Diamond Industrial Corp. of Japan.

One implementation of the grinding process uses the following parameters. The workpiece spindle is operated at 500 rpm and the grinding wheel spindle is operated at 1500 rpm. The x-axis feed rate is 10 microns/min for first 50-300 microns using the rough wheel and 1 micron/min for last 50-100 microns using the fine wheel. The coolant is 18 megohms-cm deionized water.

As shown in FIG. 5A, after grinding, the piezoelectric layer essentially has a flat surface with both securely attached grains and loose grains of piezoelectric material, as well as a paste 119 made up of particles of piezoelectric material and grinding fluid. The grinding process cleaves many of the grains of piezoelectric material, but also loosens some of the grains. As shown in FIG. 5B, following the grinding, the piezoelectric material can be cleaned in a 1% solution of fluoroboric acid ($HBF_4$) to remove surface damage caused by the grinding. The grains of piezoelectric material that were loosened by the grinding process are substantially removed, leaving small recesses 121, while the securely attached grains 120 remain. The cleaning can also remove any additional materials that are may be left on the piezoelectric material surface, such as the paste 119. The surface morphology can be measured with a Zygo model Newview 5000 interferometer with Metroview software, available from Zygo Corp, Middlefield, Conn.

As shown in FIG. 6, ground cuts 140 are made into the second surface 113 of the piezoelectric layer 107 (step 324, FIG. 25). The piezoelectric layer 107 is sawed into or diced to create the ground cuts 140. The ground cuts 140 are made such that they extend as deep or deeper than the final thickness of the piezoelectric portion of the actuators when then structures are complete (item 109 in FIG. 1). In one implementation, the ground cuts 140 are about forty microns in depth and the piezoelectric material layer in the completed actuator is between about fifteen and thirty five microns thick. The ground cuts 140 can have a cross-section that is rounded at the base of the cut.

Referring FIG. 7, a bottom view of one implementation of a piezoelectric layer 107 is shown. Multiple cuts are shown across the entire surface of the piezoelectric material to show multiple actuators being formed. The ground cuts 140 extend far enough along the width of the bottom of the piezoelectric layer 107 so that each piezoelectric actuator has a ground cut 140. To simplify manufacture, the ground cuts 140 can extend the entire width of the piezoelectric layer 107. In the illustrated implementation, the bottom of the piezoelectric layer 107 will be aligned with a body having eighteen dies 150, the locations of which are indicated in phantom. A pair of ground cuts can pass through each die because each die 150 includes two rows of structures, and the two rows will each need separate connections to the ground electrodes.

As shown in FIG. 8, a conductive layer 158 is formed on the bottom surface 113 of the piezoelectric layer 107 (step 327, FIG. 25). The conductive layer 158 will eventually become the bottom electrode as well as a conductive wrap-around 280 that enables electrical contact from the bottom electrode to the top surface of the piezoelectric layer 107. The conductive wrap-around 280 portion is located on the walls of the ground cuts 140. The coating can be by vacuum depositing, e.g., sputtering. Conductors for deposit can include copper, gold, tungsten, tin, indium-tin-oxide (ITO), titanium, platinum, a combination of metals, or other materials that would be desirable for use as an electrode. In one implementation, the conductive layer includes stacked layers of titanium-tungsten, gold-tin and gold.

Referring to FIG. 9, isolation cuts are also made through the conductive layer 158 and into the piezoelectric layer 107 (step 333, FIG. 25). The isolation cuts separate the piezoelectric material of one piezoelectric actuator from the piezoelectric material of a neighboring piezoelectric actuator, which can reduce and in some cases eliminate cross-talk between neighboring actuators. The isolation cuts are made to be deeper than the final thickness of the piezoelectric layer. In one implementation, the cuts are not as deep as the total thickness of the piezoelectric layer 107 in which the cuts are made. In one implementation, the isolation cuts 165 are at least 15 microns deep. If the ground cuts 140 lie along the X-axis of the piezoelectric layer 107, the isolation cuts 165 can be made along the Y-axis of the piezoelectric layer 107 such that the ground cuts 140 are perpendicular to the isolation cuts 165. The isolation cuts 165 are made after the step of forming a conductive layer so that the cuts that do not have conductive material along their vertical walls, unlike the ground cuts 140.

As shown in FIG. 10, additional X-axis isolation cuts 168 can be formed that are parallel to the ground cuts 140. These X-axis isolation cuts 168 can be used in a MEMS device with two rows of structures to separate the piezoelectric actuators of adjacent structures that face one another, such as the structures 130 and 131 in FIG. 1C. A bottom view of the piezoelectric layer 107 shows the ground cuts 140, along with the optional X-axis isolation cuts 168 and the isolation cuts 165 along the Y-axis (the corresponding location of individual dies are shown in phantom). The isolation cuts 165 are made in the area that corresponds to the printhead die location 152.

Referring to FIG. 11, alignment cuts 171 are formed in the bottom surface 113 of the piezoelectric layer 107 (step 336, FIG. 25). The cuts 171 can be used in a subsequent aligning step, as described further below. The alignment cuts 171 extend entirely through the piezoelectric layer 107 and can extend partially into the handle layer 135. In one implementation, the alignment cuts are around 80 microns in depth. The alignment cuts 171 can be made either along the X-axis of the piezoelectric layer 107, i.e., parallel to the ground cuts, or along the Y-axis. The alignment cuts 171 are made in a peripheral portion of the piezoelectric layer 107, such as outside of the area of the piezoelectric layer 107 that corresponds to the printhead die location 152, such as between the printhead die location 152 and the edge of the piezoelectric layer 107. The alignment cuts 171 do not overlap the portion of the piezoelectric layer 107 that subsequently will form the individual actuators. Alternatively, if the handle layer 135 is wider than the piezoelectric layer 107, and the alignment cuts 171 can be made in the handle layer 135 in a region that is outside if the piezoelectric layer 107.

As shown in FIG. 12, alignment slots 182 are made into the piezoelectric layer 107 (step 340, FIG. 25). The alignment slots 182 can be made by plunging a saw into the top surface of the handle layer 135. This forms a semicircular profiled cut. To reduce the risk of breaking or weakening the assembly (the piezoelectric layer 107 and handle layer 135), the alignment slots 182 are made orthogonal to the alignment cuts 171 and only a couple of alignment slots are made. The alignment slots 182 need only be deep enough to intersect the alignment cuts 171. As shown in FIG. 13, a top view through the handle layer 135 reveals that the intersection of the cuts and the slots. The through-holes 185 can be used to align the piezoelectric layer 107 with the body.

Referring to FIG. 14, a body 200 with chambers 205 is provided for attaching to the piezoelectric layer 107. The chambers 205 are spaced such that when the piezoelectric layer 107 is brought together with the body 200, the chambers 205 are aligned with the conductive layer 158 that is between each of the isolation cuts 165. The chambers 205 can be narrower, as wide as or wider than the piezoelectric layer 107 between each isolation cut 165.

The body 200 can be formed from multiple layers or from a single layer. When the body is formed from multiple layers, the layers can be joined together to form a laminated structure. If the layers are each of the same material, such as silicon, joining the layers together can form a monolithic body with virtually imperceptible seams, as described in U.S. Provisional Application Ser. No. 60/510,459, entitled "Print Head with Thin Membrane", filed Oct. 10, 2003, the disclosure of which is hereby incorporated by reference. The chambers can be covered by a membrane that is flexible and can transmit the movement of the piezoelectric layer 107 to the chamber.

In one implementation, the body 200 is a fluid ejection device constructed for ejecting droplets or streams of fluids, such as ink. In addition to the chamber 205, the body can have an ink delivery path that fluidly connects the chamber 205 to a reservoir where the ink is stored. The chamber 205 can also include a filter structure (not shown) to prevent debris traveling with the ink from flowing through the chamber 205. The chamber 205 can be connected to an outlet, such as a nozzle, by a descender path.

A bonding layer 193 can be formed on the body 200, such as by spinning on a layer of bonding material. The bonding layer 193 can include an adhesive, such as BCB. Alternatively, the bonding layer 193 can be formed on the conductive layer 158. The bonding layer 193 can be very thin, such as around 0.1 to 0.3 microns.

Referring to FIG. 15, the piezoelectric layer 107 is positioned and aligned with the body 200 (step 344, FIG. 25). Specifically, the piezoelectric layer 107 and body 200 are aligned along the Y-axis so that the separation cuts 165 are aligned with walls 208 between the chambers 205 in the body 200. In one implementation, the piezoelectric layer 107 is aligned along the X-axis so that the ground cuts 140 do not overlie the chambers 205.

If the body 200 is formed of silicon, an infrared camera can be used to reveal the locations of the walls 208. A smooth silicon surface is substantially transparent to infrared light, allowing the camera to detect the features formed in the silicon body 200. An alignment mark can be formed in a peripheral portion of the silicon body 200. The through-holes 185 can be aligned with the alignment mark to align the piezoelectric layer 107 with the body 200, thereby aligning the isolation cuts 165 with the walls 208.

As shown in FIG. 16, after alignment, the conductive layer 158 or body 200, depending on the surface to which the adhesive is applied, is brought into contact with the bonding layer 193 (step 349, FIG. 25). If BCB is used as the adhesive, the body 200 and piezoelectric layer 107 are held together and heated. In one implementation, the assembly is heated to around 200° C. for about 40 hours to polymerize the BCB. If the surface of the body 200 or the conductive layer 158 is slightly rough, slipping between the piezoelectric layer 107 and the body 200 can be prevented. In one implementation, a substantial quantity of BCB is applied to the conductive layer 158 or the body 200 such that when the body 200 and piezoelectric layer 107 are brought together, the BCB fills at least a portion of the separation cuts 165 and/or the isolation cuts 165. In one implementation, a metal eutectic bond adheres the body 200 and the piezoelectric layer 107 together.

As shown in FIG. 17, the handle layer 135 and a portion of the piezoelectric layer 107 are removed from the assembly (step 352, FIG. 25). The handle layer 135 and the piezoelectric layer 107 can be ground to completely remove the handle layer 135 and thin the piezoelectric layer 107 to at least the extent that the conductive material in the base of the ground cuts 140 is removed. In one implementation, the piezoelectric layer 107 is thinned to between 10 and 35 microns, such as around 20 microns. This thinning step thins the piezoelectric layer 107 to its final thickness and forms individual islands of piezoelectric material. The bonding layer 193 is not shown in this and the following figures for the sake of simplicity.

Referring to FIG. 18, an upper conductive layer 210 is formed over islands of the thinned piezoelectric layer 107 (step 359, FIG. 25). The upper conductive layer 210 can be formed using vacuum deposit techniques, as described above. The upper conductive layer 210 will be used to form the top electrode 106.

As shown in FIG. 19, a layer of photoresist 214 is deposited onto the upper conductive layer 210, such as by spin-coating. The photoresist is then exposed and developed to define the locations of the upper electrodes, as shown in FIG. 20.

As shown in FIG. 21, the upper conductive layer 210 is then etched to form individual electrodes (step 364, FIG. 25). The upper electrodes can be the same width or narrower than the piezoelectric islands upon which they are located. In one embodiment, the upper electrode is narrower than the pumping chamber. The ratio between the width of the upper electrode and the pumping chamber can be about 0.5 to about 1.2, such as about 0.65 to about 0.9. Additionally, the piezoelectric islands can be the same width, wider or narrower than the chambers over which they are positioned. If the piezoelectric islands are wider than the pumping chamber, such as between about 10 and 20 microns wider, the walls between the pumping chambers can support the PZT islands. Forming the piezoelectric island wider than the chambers allows for a greater pressure to be applied to the MEMS body and piezoelectric layer assembly during bonding while reducing the risk of the piezoelectric portion punching through the membrane when the pressure is applied. If the lower electrodes are ground electrodes, the ground electrodes of each piezoelectric actuator can either be connected together or each structure's ground can be isolated.

As shown in FIG. 22, in patterning of the upper conductive layer 210, a lower electrode contact area 211 is formed for the lower conductive layer 158 on the top surface of the piezoelectric layer 107. Because the ground cuts 140 are made to be deeper then the final depth of the piezoelectric layer 107, after the piezoelectric layer 107 is ground to its final thickness, the conductive wrap-around 280 extends so that the conductive material is level with the top of the piezoelectric layer 107. The top conductive layer, and the lower electrode contact area 211, electrically contacts the conductive wrap-around 280 and therefore is electrically connected to the lower conductive layer 158 or bottom electrode. (The conductive wrap-around 280 is formed by the step of forming the conductive layer (step 327, FIG. 25) after the ground cuts 140 are formed.) The patterning process removes conductive material in an electrode break area 220 to electrically separate the lower electrode from the top electrode 106 conductive material.

Multiple dies each having multiple structures can be formed from common layers, such as a single silicon substrate and a single layer of piezoelectric material. During processing of the body 200, streets 103 can be formed in the bottom surface of the body to define the boundaries between the dies. The streets 103 are recesses that do not transverse the thickness of the body. Additional saw cuts 102 can be made in the top of the piezoelectric layer 107 in locations that correspond to the streets. The saw cuts 102 need not extend entirely to the streets 103. Rather, the individual dies can be separated from one another by manually breaking the assembly along the streets 103 (step 367). The streets 103 can be formed and dies can be broken in an area that aligns with the ground cut 140.

Referring to FIG. 23, an electrically conducting material 215, 225, such as a conductive adhesive or solder, can be disposed on the actuator (step 371, FIG. 25). The flexible circuit and the actuator are brought into contact. The flexible circuit 229 is also in contact with the ground, or the bottom electrode, by way of the electrode contact area 221. A drive voltage can be applied to the electrodes, which drives the piezoelectric layer 107.

Referring to FIG. 24, in one implementation, the structure can be constructed to minimize input power into the portions of the piezoelectric layer 107 that do not actuate the chamber 205. A contact pad 224 can be sufficiently sized to be bonded to the flexible circuit 229. If the entire length of the piezoelectric island is not involved in actuating the pumping chamber, a narrow electrode portion 230 can be formed that reduces loss of power to portions of the piezoelectric island that need not be actuated.

Difficulties posed by conventional methods of forming piezoelectric actuators can be overcome with the methods described herein. Piezoelectric layers that are formed from pre-fired sheets of piezoelectric material can allow for treating the piezoelectric material with techniques that the body may not be able to withstand without damage to the body. For example, if the piezoelectric actuator is formed separately from the body, the piezoelectric material can be fired to a temperature that creates better maturing and grain growth. The same high temperatures may not be tolerated by the other components of the MEMS. Additionally, bulk piezoelectric materials can have higher d coefficients, dielectric constants, coupling coefficients, stiffness and density than sputtered or sol-gel piezoelectric materials. Piezoelectric materials formed by other methods, such as by sol-gel application to the body, can require that there be additives in the piezoelectric pre-cursor. The additives are often burned off, creating a less dense piezoelectric material than can be formed when the bulk piezoelectric material is formed separately from the body. Forming a bulk piezoelectric material separately from the body allows the material to include fewer or no additives. Additionally, the bulk material can be fired under pressure. Higher temperatures and pressures make the material denser, which generally improves the material properties, and in particular, reduces the number of voids in the material. Voids can create electrical shorts and ruin the device.

However, processing pre-fired sheets of piezoelectric material to form piezoelectric actuators can lead to risks. For example, if the piezoelectric layer is cut to separate individual actuators after bonding the piezoelectric material to the body, there is a risk of cutting into the chamber body, which can potentially cause leaks. Conversely, there is a risk of not cutting deeply enough into the piezoelectric material, leaving tabs between neighboring structures. If the cuts are not uniform, the structures may each have varying degrees of piezoelectric response to the same power input, and cross-talk can occur between structures. The cut depth non-uniformity can occur because of saw blades that become worn with use or variation in saw positioning with respect to the piezoelectric layer.

Forming the piezoelectric actuators by grinding and dicing the piezoelectric material prior to bonding the material onto the chamber body can create uniformly thick piezoelectric actuators. The piezoelectric portion can be uniformly thick across a single actuator. The actuators can also have a very uniform thickness across a group of actuators. As an example of the dimensional uniformity that can be achieved across structures in a die, each structure can have a piezoelectric actuator that is between about 25 and 200 microns, or approximately 150 microns wide, the die having between 100 and 200 structures in a row, and the difference in thicknesses across the piezoelectric actuators of a die can be as little as two microns. Cutting individual islands followed by grinding down the piezoelectric material can form islands with top and bottom surfaces that are parallel to one another. This geometry may not be achieved with a screen printing method or by depositing green sheets of ceramic material, patterning the ceramic material and firing the ceramic materials. Methods such as, firing green sheets, screen printing and sol-gel application, can form piezoelectric actuators that do not have a rectangular cross section. For example, these methods can form actuators with a planar bottom and a curved top or a cross-section that appears to have the upper corners of the rectangle removed. By cutting the islands from a bulk piezoelectric material, the thickness of the actuator across the width and length of the actuator can be very uniform. Piezoelectric actuators with high uniformity of dimensions can exhibit very uniform piezoelectric characteristics.

Forming the cuts prior to bonding the piezoelectric material can allow for the wrap-around electrode structure to be formed. The wrap-around electrode structure creates a contact area for the bottom electrode that is on the top of the piezoelectric layer. The wrap-around electrode structure can simplify connecting an integrated circuit to the actuators.

Forming the actuators to be narrower than the width of the pumping chamber can concentrate the displacement of the actuator over the most flexible portion of the membrane. By making the actuators narrower, less voltage is required to actuate the piezoelectric material. The top electrode can be made narrower than the piezoelectric layer to concentrate the voltage at the central portion of the piezoelectric layer. This can reduce competing piezoelectric forces across the piezoelectric layer. Forming the upper electrode to be narrower than the piezoelectric layer causes the actuator to respond better to input voltage. Better actuator response allows for a lower drive voltage to be applied across the actuator to achieve the desired actuator response. The advantage of forming the actuators to be wider than the pumping chamber is that the walls surrounding the pumping chambers can support the actuators. If the walls support the pumping chambers, the risk of the actuators breaking through the membrane is reduced. In particular, if pressure is applied to the actuators, such as during a bonding process, the likelihood of damaging the device is reduced.

Thinning a relatively thick piezoelectric layer after bonding the layer to a handle layer can facilitate processing steps for forming the actuator. If the piezoelectric layer is not thinned to a suitable working thickness prior to bonding onto the chamber body, a longer thinning process may be required after bonding. Also, it is desirable that the handle material is stiffer than the piezoelectric layer. A stiffer handle layer allows the assembly to expand close to the thermal expansion of the handle material when the assembly is heated. However, thinning the piezoelectric layer to its final thickness before attaching to the handle layer may not enable the desired thickness to be achieved without damaging the piezoelectric layer. The handle layer provides a base for securing the piezoelectric material during thinning. If the apparatus for thinning the piezoelectric material can secure the handle layer rather than securing the piezoelectric layer during thinning, there is less likelihood that the securing feature will interfere with the thinning process. In one implementation, the handle is clamped to the thinning apparatus and a grinding wheel grinds the piezoelectric layer to the desired thickness. Because the clamp only needs to contact the handle layer, the clamp need not interfere with the grinding wheel.

Grinding can cause some of the exposed grains to be loosened from the piezoelectric material. Additionally, a paste-like substance is formed by the grinding, the paste-like substance including broken bits of piezoelectric material. The paste-like substance can be deposited on the piezoelectric layer during grinding. The paste-like substance and the loosened grains can create gaps in the bonding between the piezoelectric layer and the conductive layer. The degree of these gaps can vary from spot-to-spot and cause variations in performance.

Cleaning the piezoelectric material after grinding removes the loosened grains of piezoelectric material and paste and causes the surface of the piezoelectric material to consist mainly of fully secured grains of piezoelectric material. The cleaning creates a rougher surface, but improves the efficiency and uniformity of the piezoelectric characteristics of the piezoelectric material over piezoelectric material that has a flat surface with loosened piezoelectric grains of material. Cleaning the piezoelectric material after grinding also improves the surface for applying a conductive material. If the surface is free of paste and loosened grains of material, the likelihood of gaps existing between the conductive material and the cohesive block of piezoelectric material is reduced.

The thermal expansion of piezoelectric material can be controlled by bonding the piezoelectric material to a handle layer prior to bonding the piezoelectric material to the body. When the piezoelectric material and the chamber body are heated to form the bond between the two structures, the piezoelectric material (or other suitable piezoelectric material) and the material used to form the body can expand at different rates, particularly if the body is made from a material other than piezoelectric material, such as silicon. Moreover, the expansion and contraction of piezoelectric material due to thermal change can be variable. That is, piezoelectric material that is heated up and cooled back to its original temperature may not immediately return to its originally size. The rate of thermal expansion and contraction can vary due to different factors, such as how long ago the material has been poled and how many thermal cycles the material has already experienced. The changes in the size of the chamber body and piezoelectric material caused by heating can change the alignment of the chamber walls with respect to the separation cuts.

If the handle layer is made up of the same material as body, the handle material can control the expansion rate of the piezoelectric material such that the expansion rates of the piezoelectric material and the body are substantially the same. Particularly when the handle layer is much thicker than the piezoelectric material, the handle layer can force the piezoelectric material to expand and contract with the handle layer. In one implementation, the piezoelectric material is PZT and the handle layer is silicon that has a thickness that is ten times that of the PZT layer. Silicon is approximately three times stiffer than PZT. Between the difference in thickness and stiffness, silicon appears to have a spring rate that is thirty times that of the PZT. The material with the greater apparent spring rate overrides the expansion and contraction of the other material thereby causing the PZT to expand at the same rate as the silicon.

The piezoelectric actuator described above can be used to form a number of micromechanical devices, such as a sensors, transducers, or ink jet printheads with piezoelectric actuators.

A number of embodiments of the invention have been described. Nevertheless, it will be understood that various modifications may be made without departing from the spirit and scope of the invention. For example, the actuators can be formed so that they are parallel to one another, but at an angle with respect to the piezoelectric layer. The actuators can be made by forming recesses into the body of piezoelectric material that are not perpendicular to the surface, but an angle. Alternatively, the recesses can have a central axis that is perpendicular to the surface of the body, but sidewalls that are at an angle other than 90° to the surface of the body. For example, the sidewalls can form islands with a trapezoidal shape, where the wider portion of the trapezoid is further away from the pumping chamber than the narrower portion. Piezoelectric materials other than PZT can be used to form the actuators. The drive electrode connection can be on the island above the pumping chamber and the ground electrode connection can be on an island of piezoelectric material that is on the periphery of the die, e.g., a contact island, rather than having both the drive and ground connections being on the island situated over the pumping chamber. Alternatively, the piezoelectric island need not have a wrap-around electrode. The bottom electrode can extend beyond the piezoelectric island and be electrically separated from the top electrode. In one implementation, the electrodes are only formed on one surface of the piezoelectric material. In one implementation, the grinding is stopped before the cuts or recesses are exposed. This leaves a bridge of piezoelectric material between the actuators. The bridge can be sufficiently small to minimize cross-talk between the devices. The body to which the piezoelectric material is attached need not have chambers formed therein. If chambers, or other features are to be formed in the body, the chambers can be formed after the piezoelectric material is attached to the body. Accordingly, other embodiments are within the scope of the following claim.

What is claimed is:
1. A device, comprising:
a handle layer; and
a piezoelectric layer having a first surface, a second surface, and a thickness that extends between the first surface and the second surface, wherein the first surface is bonded to the handle layer, the second surface has multiple cuts defining multiple actuator regions, and the multiple cuts extend through a portion of the thickness but not entirely through the thickness of the piezoelectric layer, and wherein the multiple cuts comprise at least one ground cut extending along a first direction and at least one isolation cut extending along a second direction perpendicular to the first direction.

2. The device of claim 1, further comprising a bonding layer between the first surface and the handle layer.

3. The device of claim 2, wherein the bonding layer comprises benzocyclobutene.

4. The device of claim 1, wherein the handle layer comprises silicon.

5. The device of claim 1, wherein the piezoelectric layer comprises a flatness of about 0.25 microns or less.

6. The device of claim 5, wherein the flatness is about 0.1 microns or less.

7. The device of claim 1, wherein the piezoelectric layer comprises a surface finish of about 5 nm Ra or less.

8. The device of claim 1, wherein each of the multiple cuts has a cross-section that is rounded at a base of the each of the multiple cuts.

9. The device of claim 1, further comprising a conductive layer on the second surface of the piezoelectric layer.

10. The device of claim 9, wherein the conductive layer coats at least one wall of the ground cut but walls of the isolation cut are free of the conductive layer.

11. The device of claim 1, further comprising alignment cuts that extend entirely through the thickness of the piezoelectric layer.

12. The device of claim 11, wherein the alignment cuts extend into the handle layer.

13. The device of claim 11, wherein the alignment cuts are formed in a region outside a portion of the piezoelectric layer where the multiple actuator regions are located.

14. The device of claim 11, further comprising alignment slots formed in the handle layer that intersect the alignment cuts.

15. The device of claim 14, wherein the alignment slots are orthogonal to the alignment cuts.

16. The device of claim 1, wherein the handle layer is wider than the piezoelectric layer, and the device further comprises alignment cuts formed in the handle layer in a region outside the piezoelectric layer.

17. The device of claim 1, wherein the thickness of the piezoelectric layer is less than about 200 microns.

18. The device of claim 17, wherein the thickness of the piezoelectric layer is less than about 50 microns.

19. The device of claim 1, wherein the handle layer has a thickness between about 400 to 1000 microns.

20. The device of claim 1, wherein the piezoelectric layer has a density of about 7.5 g/cm$^3$ or more and a d31 coefficient of about 200 or more.

21. A device comprising:
a handle layer; and
a piezoelectric layer having a first surface, a second surface, and a thickness that extends between the first surface and the second surface, wherein the first surface is bonded to the handle layer, the second surface has multiple cuts defining multiple actuator regions, and the multiple cuts extend through a portion of the thickness but not entirely through the thickness of the piezoelectric layer, and wherein each of the multiple cuts cut has a cross-section that is rounded at a base of the each of the multiple cuts.

22. A device comprising:
a handle layer;
a piezoelectric layer having a first surface, a second surface, and a thickness that extends between the first surface and the second surface, wherein the first surface is bonded to the handle layer, the second surface has multiple cuts defining multiple actuator regions, the multiple cuts include at least one ground cut and at least one isolation cut, and each of the multiple cuts extends through a portion of the thickness but not entirely through the thickness of the piezoelectric layer; and
a conductive layer on the second surface of the piezoelectric layer, the conductive layer coating at least one wall of the ground cut but walls of the isolation cut are free of the conductive layer.

* * * * *

UNITED STATES PATENT AND TRADEMARK OFFICE
CERTIFICATE OF CORRECTION

PATENT NO.         : 8,053,956 B2                                      Page 1 of 1
APPLICATION NO.    : 12/435099
DATED              : November 8, 2011
INVENTOR(S)        : Andreas Bibl and John A. Higginson It is certified that error appears in the above-identified patent and that said Letters Patent is hereby corrected as shown below:

At page 5, column 16, line 19, in Claim 21:

after "cuts" delete "cut".

Signed and Sealed this
Twenty-fourth Day of January, 2012

David J. Kappos
*Director of the United States Patent and Trademark Office*